US006830806B2

(12) United States Patent
Holl et al.

(10) Patent No.: US 6,830,806 B2
(45) Date of Patent: Dec. 14, 2004

(54) METHODS OF MANUFACTURE OF ELECTRIC CIRCUIT SUBSTRATES AND COMPONENTS HAVING MULTIPLE ELECTRIC CHARACTERISTICS AND SUBSTRATES AND COMPONENTS SO MANUFACTURED

(75) Inventors: Richard A. Holl, Camarillo, CA (US); Philip L. Lichtenberger, Thousand Oaks, CA (US)

(73) Assignee: Kreido Laboratories, Camarillo, CA (US)

( * ) Notice: Subject to any disclaimer, the term of this patent is extended or adjusted under 35 U.S.C. 154(b) by 288 days.

(21) Appl. No.: 10/121,631

(22) Filed: Apr. 11, 2002

(65) Prior Publication Data

US 2002/0148640 A1 Oct. 17, 2002

Related U.S. Application Data

(60) Provisional application No. 60/283,501, filed on Apr. 12, 2001.

(51) Int. Cl.[7] ............................................. B32B 3/00
(52) U.S. Cl. .................... 428/323; 428/209; 428/320.2; 428/322.2
(58) Field of Search ..................... 428/320.2, 322.2, 428/323, 209, 210

(56) References Cited

U.S. PATENT DOCUMENTS 591,494 A  10/1897  Pond (List continued on next page.)

FOREIGN PATENT DOCUMENTS

DE   299 02 348   4/1999   ............ G02B/26/00

(List continued on next page.)

OTHER PUBLICATIONS

US 6,159,264, 12/2000, Holl (withdrawn)
International Search Report dated Aug. 6, 2002.

(List continued on next page.)

Primary Examiner—Cathy Lam
(74) Attorney, Agent, or Firm—Greenberg Traurig, LLP; Christopher Darrow, Esq.

(57) ABSTRACT

The present invention is directed to methods for producing substrates for electric circuits, particularly ultra high frequency circuits, and electric components for mounting thereon employing for the purpose mixtures of polymers and finely powdered filler materials, the latter having specific electric characteristics, such as dielectric constant and/or resistivity. Any one substrate or component can be manufactured to have at least two body regions, and even multiple body regions, each of which has a different characteristic such as dielectric constant or resistivity. The regions can be formed separately as substrate or component preforms and thereafter placed together in a mold and united into a single body by a heating and pressing operation that at least melts polymer at the junctions to bond them together. If necessary, the heat and pressure conditions are such as to melt the polymer and force it uniformly into the interstices between the filler particles to form a strong, unitary body. The characteristics can be specifically chosen to assist in impedance matching facilitating the circuit design. Articles produced according to the methods of the invention can be made to have fixed external physical dimensions despite differences in the sizes of the operative elements therein; one of the body regions can encapsulate the other region or regions to simultaneously package them. In addition to significantly increasing ease of circuit design, the components themselves, when manufactured according to the methods of the invention, require fewer additional steps than many common prior art methods.

8 Claims, 4 Drawing Sheets

U.S. PATENT DOCUMENTS

| | | | |
|---|---|---|---|
| 2,261,257 A | 11/1941 | Kiesskalt et al. | 241/228 |
| 2,295,740 A | 9/1942 | Keen | 261/93 |
| 2,314,598 A | 3/1943 | Phelan | 62/114 |
| 2,474,006 A | 6/1949 | Maycock | 261/83 |
| 2,577,247 A | 12/1951 | Irwin | 99/221 |
| 3,095,349 A | 6/1963 | Rich | 162/236 |
| 3,215,642 A | 11/1965 | Levy | 252/359 |
| 3,595,531 A | 7/1971 | Williams et al. | 259/7 |
| 3,841,814 A | 10/1974 | Eckhardt | 425/208 |
| 3,870,082 A | 3/1975 | Holl | 138/40 |
| 4,000,993 A | 1/1977 | Holl | 55/94 |
| 4,057,331 A | 11/1977 | Ong et al. | 350/285 |
| 4,071,225 A | 1/1978 | Holl | 366/114 |
| 4,073,567 A | 2/1978 | Lakerveld et al. | 350/6.5 |
| 4,174,907 A | 11/1979 | Suh et al. | 366/279 |
| 4,198,383 A | 4/1980 | Konsetov et al. | 422/134 |
| 4,251,576 A | 2/1981 | Osborn et al. | 428/331 |
| 4,287,075 A | 9/1981 | Fujiwara et al. | 501/135 |
| 4,306,165 A | 12/1981 | Kitabayashi et al. | 310/59 |
| 4,311,570 A | 1/1982 | Cowen et al. | 204/157.1 |
| 4,315,172 A | 2/1982 | Intichar et al. | 310/53 |
| 4,335,180 A | 6/1982 | Traut | 428/303 |
| 4,405,491 A | 9/1983 | Sando et al. | 252/359 |
| 4,456,368 A * | 6/1984 | Isaka et al. | 399/336 |
| 4,556,467 A | 12/1985 | Kuhn et al. | 241/193 |
| 4,593,754 A | 6/1986 | Holl | 165/109.1 |
| 4,670,103 A | 6/1987 | Holl | 165/109.1 |
| 4,708,198 A | 11/1987 | Holl | 165/109.1 |
| 4,744,521 A | 5/1988 | Singer et al. | 241/66 |
| 4,769,131 A | 9/1988 | Noll et al. | 210/85 |
| 4,778,631 A | 10/1988 | Cobbs, Jr. et al. | 261/128 |
| 4,784,218 A | 11/1988 | Holl | 165/109.1 |
| 4,889,909 A | 12/1989 | Besecke et al. | 528/125 |
| 4,921,473 A | 5/1990 | Lee et al. | 494/27 |
| 4,930,708 A | 6/1990 | Chen | 241/65 |
| 4,983,307 A | 1/1991 | Nesathurai | 210/748 |
| 5,098,769 A * | 3/1992 | Nakai et al. | 428/195.1 |
| 5,154,973 A | 10/1992 | Imagawa et al. | 428/325 |
| 5,198,137 A | 3/1993 | Rutz et al. | 252/62.54 |
| 5,204,416 A | 4/1993 | Mercer et al. | 525/390 |
| 5,212,278 A | 5/1993 | Pfaendner | 528/171 |
| 5,227,637 A | 7/1993 | Herold et al. | 250/438 |
| 5,268,140 A | 12/1993 | Rutz et al. | 75/246 |
| 5,279,463 A | 1/1994 | Holl | 241/1 |
| 5,300,019 A | 4/1994 | Bischof et al. | 604/4 |
| 5,335,992 A | 8/1994 | Holl | 366/348 |
| 5,358,775 A | 10/1994 | Horn, III | 428/209 |
| 5,370,824 A | 12/1994 | Nagano et al. | 366/279 |
| 5,370,999 A | 12/1994 | Stuart | 435/99 |
| 5,391,603 A | 2/1995 | Wessel et al. | 524/396 |
| 5,395,914 A | 3/1995 | Wilharm et al. | 528/125 |
| 5,449,652 A | 9/1995 | Swartz et al. | 501/134 |
| 5,471,037 A | 11/1995 | Goethel et al. | 219/750 |
| 5,484,647 A | 1/1996 | Nakatani et al. | 428/209 |
| 5,506,049 A | 4/1996 | Swei et al. | 428/323 |
| 5,523,169 A | 6/1996 | Rafferty et al. | 428/551 |
| 5,538,191 A | 7/1996 | Holl | 241/1 |
| 5,552,210 A | 9/1996 | Horn, III et al. | 428/209 |
| 5,554,323 A | 9/1996 | Tsukimi et al. | 264/4.7 |
| 5,558,820 A | 9/1996 | Nagano et al. | 264/4.1 |
| 5,576,386 A | 11/1996 | Kempter et al. | 526/88 |
| 5,658,485 A | 8/1997 | Cava et al. | 252/62.9 |
| 5,658,994 A | 8/1997 | Burgoyne, Jr. et al. | 525/390 |
| 5,659,006 A | 8/1997 | White | 528/212 |
| 5,674,004 A | 10/1997 | Takeuchi | 366/69 |
| 5,693,742 A | 12/1997 | White et al. | 528/212 |
| 5,739,193 A | 4/1998 | Walpita et al. | 524/413 |
| 5,754,936 A | 5/1998 | Jansson | 419/10 |
| 5,855,865 A | 1/1999 | Lambert et al. | 424/9.52 |
| 5,874,516 A | 2/1999 | Burgoyne, Jr. et al. | 528/219 |
| 5,929,138 A | 7/1999 | Mercer et al. | 523/220 |
| 5,974,867 A | 11/1999 | Forster et al. | 73/61.41 |
| 5,998,533 A | 12/1999 | Weber et al. | 524/540 |
| 6,039,784 A | 3/2000 | Luk | 75/231 |
| 6,040,935 A | 3/2000 | Michalicek | 359/198 |
| 6,074,472 A | 6/2000 | Jachow et al. | 106/436 |
| 6,093,636 A | 7/2000 | Carter et al. | 438/623 |
| 6,130,627 A * | 10/2000 | Tyburski et al. | 340/933 |
| 6,134,950 A | 10/2000 | Forster et al. | 73/54.01 |
| 6,143,052 A | 11/2000 | Kiyokawa et al. | 75/230 |
| 6,176,991 B1 | 1/2001 | Nordman | 204/601 |
| 6,190,034 B1 | 2/2001 | Nielsen et al. | 366/336 |
| 6,281,433 B1 | 8/2001 | Decker et al. | 174/35 |
| 6,294,968 B1 * | 9/2001 | Ito et al. | 333/202 |
| 6,391,082 B1 | 5/2002 | Holl | 75/230 |
| 6,415,507 B1 * | 7/2002 | Shimosato et al. | 29/890.1 |
| 6,464,936 B1 | 10/2002 | Mowat et al. | 422/22 |
| 6,471,392 B1 | 10/2002 | Holl et al. | 366/279 |
| 2001/0030295 A1 | 10/2001 | Holl | 250/492.23 |
| 2002/0038582 A1 | 4/2002 | Holl | 75/230 |
| 2002/0078793 A1 | 6/2002 | Holl | 75/230 |
| 2002/0089074 A1 | 7/2002 | Holl | 261/92 |
| 2002/0148640 A1 | 10/2002 | Holl | 174/256 |
| 2003/0043690 A1 | 3/2003 | Holl | 366/279 |
| 2003/0066624 A1 | 4/2003 | Holl | 165/47 |

FOREIGN PATENT DOCUMENTS

| | | | |
|---|---|---|---|
| DE | 299 19 570 | 1/2000 | B29C/45/74 |
| EP | 0 219 357 | 4/1987 | G02B/26/08 |
| EP | 0 660 336 | 6/1995 | H01B/3/04 |
| GB | 891 152 | 3/1962 | |
| GB | 1 232 644 | 5/1971 | B02C/1/02 |
| GB | 1 252 192 | 11/1971 | H02K/5/20 |
| GB | 2 192 558 | 1/1988 | B01F/3/08 |
| JP | 58 144549 | 8/1983 | H02K/1/18 |
| JP | 3 279991 | 12/1991 | G09F/3/02 |
| JP | 11322920 | 11/1999 | C08G/65/38 |
| JP | 2000-213876 | 8/2000 | B29C/47/88 |
| SU | 369 939 | 4/1973 | 241/1 |
| SU | 957 991 | 9/1982 | 241/301 |
| SU | 1 737 241 | 5/1992 | F27B/7/38 |
| WO | WO 97 12665 | 4/1997 | B01F/5/00 |
| WO | WO 97 42639 | 11/1997 | H01B/3/30 |
| WO | WO 98 49675 | 11/1998 | G11B/5/09 |
| WO | WO 02 071451 | 9/2002 | |
| WO | WO 03 022415 | 3/2003 | B01F/13/00 |

OTHER PUBLICATIONS

PCT International Search Report for PCT/US00/18038, Holl Technologies Company, completed Sep. 17, 2000, mailed Oct. 6, 2000.

PCT International Search Report for PCT/US01/15258, Holl Technologies Company, completed Jan. 24, 2002, mailed Feb. 1, 2002.

PCT International Search Report for PCT/US01/20635, Holl Technologies Company, completed Jan. 24, 2002, mailed Feb. 1, 2002.

PCT International Search Report for PCT/US01/23657, Holl Technologies Company, completed Apr. 25, 2002, mailed May 6, 2002.

PCT International Search Report for PCT/US02/11575, Holl Technologies Company, completed Jul. 12, 2002, mailed Aug. 6, 2002.

PCT International Search Report for PCT/US02/29093, Holl Technologies Company, completed Mar. 6, 2003, mailed Mar. 17, 2003.

PCT International Search Report for PCT/US02/31076, Holl Technologies Company, completed Dec. 11, 1002, mailed Dec. 27, 2002.
PCT International Search Report for PCT/US02/05361, Holl Technologies Company, completed May 17, 2002, mailed Jun. 5, 2002.
U.S. Appl. No. 6,159,264, Dec. 2000, Holl (withdrawn).
www.pooleplastics.com/production.html, Poole Plastics and Tooling Company, Production Capabilities; Feb. 15, 2001.
Zlotorzynski; "The Application of Microwave Radiation to Analytical and Environmental Chemistry;" Critical Reviews in Analytical Chemistry; vol. 25, No. 1; pp. 43–76; 1995.
"Microwave Heating Mechanisms;" Microwave Chemistry; G. Whittaker, 1994 & 1997.
"A Basic Introduction to Microwave Chemistry;" Microwave Chemistry; G. Whittaker, 1994 & 1997.
"Fast and Furious;" Microwave Chemistry; New Scientist; G. Whittaker, 1998.
"Microwave Heating Applied to Polymers;" Microwave Chemistry; G. Whittaker, 1994 & 1997.
"Application of Microwaves to Organic Chemistry;" Microwave Chemistry; G. Whittaker, 1994 & 1997.
"Microwave Chemistry in Liquid Media;" Microwave Chemistry; G. Whittaker, 1994 & 1997.
"Microwave Heating and Intercalation Chemistry;" Microwave Chemistry; G. Whittaker, 1994 & 1997.

* cited by examiner

METHODS OF MANUFACTURE OF ELECTRIC CIRCUIT SUBSTRATES AND COMPONENTS HAVING MULTIPLE ELECTRIC CHARACTERISTICS AND SUBSTRATES AND COMPONENTS SO MANUFACTURED

CROSS-REFERENCE TO RELATED APPLICATIONS

The contents of this application are related to and claim the filing date benefit of provisional application Ser. No. 60/283,501, filed Apr. 12, 2001. The content of this related provisional application is incorporated herein by reference.

TECHNICAL FIELD OF THE INVENTION

This invention relates to new methods for the manufacture from polymer/filler materials of composite substrates such as are used for electric circuits, particularly electronic circuits, and to components for such circuits, which substrates and components can have multiple different electric constants in respective regions thereof, and also relates to articles so manufactured. It also relates to such methods with which at least one of such regions constitutes packaging for the other region or regions.

BACKGROUND ART

An important factor in circuit design, especially at the ever higher frequencies and switching speeds that characterize modern designs, is that of the electric properties of the materials used in the manufacture of the substrates and components. For example, the dielectric properties of substrate materials used for microwave transmission media directly impact other key physical properties of the transmission lines. One of the most widely used transmission media at microwave frequencies is that known as "Microstrip". The dielectric constant of Microstrip substrates is a determinant of the width requirement for its conductors, and therefore careful selection of the substrate materials according to their electric properties, particularly their dielectric property values, is crucial to the design, layout, and overall resultant size of such circuits. Typically, the use of higher dielectric materials results in narrower conductor widths, which facilitates overall reduction in size, and this is increasingly important as the trend continues toward miniaturization of such circuits.

Another important problem inherent in electronic circuit design is that of impedance matching, which is one that has been addressed since the earliest days of electronic circuit design, and which usually is required for optimum performance when source and load impedances are unequal. Although many approaches are practiced, the problem has become increasingly challenging in view of the trend towards miniaturization of electronic circuits. This is because prior art methods typically involve the incorporation of extra components within a circuit, requiring additional space. Most commonly the matching is accomplished by inserting matching networks into the circuit between the source and the load. Simple examples might involve the use of an inductance/capacitance circuit to match unequal source and load impedances, or to optimize the gain of an amplifier. Clearly, the addition of such components and/or networks, requiring additional space, significantly hinders miniaturization efforts.

These and other methods of providing impedance matching involve the use of circuit boards that carry a pattern of conductors onto which components are assembled. The creation of these circuit patterns becomes quite complex, and has led to the development of multi-layer circuit boards. Again, the result is one of increased size. Furthermore, the need to select certain components of certain sizes according to their impedance matching abilities limits the overall design flexibility in creating circuits, especially if subsequently one or more components must be replaced with another of different values of electric and physical characteristics.

In addition to careful selection of materials for the circuits and components themselves, the problem of impedance matching must also sometimes be addressed by proper selection of packaging materials. A successful package design, such as for microwave circuits, must meet criteria for impedance matching, low dielectric loss at microwave frequencies, low sensitivity of the dielectric material and conductors to temperature changes, and low capacitance of interconnection to the backside of the ground plane. Therefore, selection of materials according to their electric properties for electronics packaging is yet another important facet for the performance optimization of circuits.

As far as we are aware, there is not currently a method for impedance matching that essentially requires no additional hardware, no additional space, and no constraints on component selection in the circuit designing process. Current impedance matching techniques simply do not provide the needed flexibility and space-saving characteristics.

A major problem resides in the difficulties in choosing a dielectric material that can meet the different requirements of different respective parts of a substrate, a component, or a packaging system, and usually this has required a careful choice on the part of the designer of a single material with which an optimum balance is achieved, accepting that the properties of the material are less suitable for some aspects than would be preferred.

DISCLOSURE OF THE INVENTION

A principal object of the present invention to provide new methods for the manufacture of electric circuit substrates, and of components for such circuits, and of packaging therefor, with which different materials of different dielectric constants can be used successfully in different regions of the substrates, or the components, or the packaging.

Another object is to provide methods for impedance matching in electric circuit substrates, components, and their packaging that are consistent with the current need for circuit miniaturization by reducing, if not eliminating, the need for additional circuitry or additional impedance matching components.

In accordance with the invention there is provided an electric circuit substrate or electric circuit component comprising a body of polymer/filler composite material and having different values of an electric characteristic in different body regions thereof, characterized in that it comprises at least a first body region having a first electric characteristic; and at least a second body region joined to the first region to have a boundary between them, the second body region having a second electric characteristic of value different from that of the same electric characteristic of the first body region.

Also in accordance with the invention there is provided a method of manufacturing an electric circuit substrate or electric circuit component comprising a body of polymer/filler composite material and having different values of an electric characteristic in different body regions thereof, characterized by forming at least a first body region of the polymer/filler composite material having a first electric characteristic; and joining to the first body region a second body region at least one boundary between them by a heat and pressure operation that melts at least polymer at the boundary to effect such joining, the second body region having a second electric characteristic of value different from that of the same electric characteristic of the first body region.

DESCRIPTION OF THE DRAWINGS

The foregoing and other objects, features, and advantages of the present invention win become apparent from the following description of embodiments thereof, given by way of example, in conjunction with the accompanying diagrammatic drawings, wherein.

The same references are used for similar parts throughout the drawings whenever that is possible.

MODES FOR CARRYING OUT THE INVENTION AND INDUSTRIAL APPLICABILITY

The present invention is directed to controlling the distribution of materials of different electric constants, such as the dielectric constant and resistivity constant, in articles manufactured from composite polymer/filler materials. The invention is further directed to providing such articles exhibiting a plurality of electric constants that are carefully selected and precisely confined to particular regions of the article body and also therefore to corresponding boundary areas of the surfaces thereof. One benefit of the use of such different electric constant materials is the flexibility it gives to the circuit designers who are no longer limited to the use predominantly of a single material with corresponding fixed electric constants that usually will not be the optimum for all parts of the circuit. Another benefit is the added facility given to impedance matching in the circuit design.

While impedance matching has long been an engineering goal in the design of circuits, the problem has traditionally been addressed by providing additional components to a circuit for "balancing" the impedance thereof. As discussed above, such components usually require additional space on a circuit board, which impairs a different, but very important, engineering goal, namely miniaturization of the circuit. The present invention provides novel approaches to the manufacture of substrates and circuit components able to provide inter alia impedance matching without necessarily requiring additional space on a circuit board. Substrates are manufactured, according to the present invention, to have a plurality of dielectric constants occupying well-defined regions of the substrate. The dielectric constants can be selected according to the kind of component that will be mounted on the respective regions or portions of the substrate. By selectively matching the components whenever possible to appropriate dielectric substrate materials, and/or by manufacturing substrates with different dielectric constant values in respective locations it becomes possible to provide at least a more closely impedance matched circuit, possibly with a reduction in the number of additional impedance matching components, and even possibly with the elimination of such need.

The materials used hitherto in circuit substrates and packaging materials usually can not be fused or adequately joined after their initial fabrication to provide precise, well defined, varied dielectric constant regions. Typically, ceramics have been materials of choice for electronic substrates because of certain desirable properties known in the art, but once formed cannot subsequently successfully be pressed or fused together to form a single piece. Multiple ceramic pieces can be adhered together with a suitable bonding agent, but usually such bonds are much weaker than the sintered ceramic materials, and such adhesion results in an undesirable additional abrupt break in the characteristics, such as the dielectric constant contributed by the adhesive. Other materials, such as the green composite matrix materials commonly used in circuit boards, do not possess sufficient heat resistance to withstand heating and fusing operations for the assembly of multiple articles into a single piece with multi-dielectric zones.

As an alternative to the use of ceramics, substrates and electronic packaging are sometimes formed of metal or semiconductor filler powders embedded in a glass or polymer matrix. A particular preferred family of polymers is polytetrafluoroethylene (PTFE). Unfortunately, such matrix forming polymers have excessive thermal expansion coefficients and low inherent strength. As a result, recent advances in substrate material fabrication have focused on the addition of reinforcing materials, such as woven glass fiber cloth, into the substrate body. While these materials are effective to strengthen the substrate, inherently they create an inhomogeneous structure by preventing uniform distribution of filler materials into the matrix forming polymers. Additionally, the fibrous materials have proven very difficult to machine, as conventional machining tools draw out the strengthening fibrils which then wrap around and impede the tools.

U.S. Patent No. 6,391,082, filed Jul. 2, 1999, entitled "Composites of Powdered Fillers and Polymer Matrix", describes materials and methods for fabricating a wide array of substrates, wherein ceramic and other powders are mixed together with a non-polar, nonfunctionalized polymer material selected from the group comprising polyarylene ether-2, polyarylene ether-3, and polyarylene ether-4, being polymers found to have adequate adhesive properties while being sufficiently thermoplastic, which requirement is explained below. Such materials are described and claimed in U.S. Pat. Ser. Nos. 5,658,994 and 5,874,516 of Air Products and Chemicals Inc. of Allentown, Penn., USA, and are low dielectric constant materials which were developed as intermetal and interlevel dielectric films for ULSI integrated circuit fabrication. U.S. Pat. No. 6,652,805, filed Oct. 5, 2001, discloses other highly loaded composite materials using other polymers for the matrix.

The inventions therein result from the unexpected discovery that composite materials employing a matrix polymer can be manufactured with unusually high solids loadings by choosing as a matrix material a polymer which, while not necessarily of high strength in bulk, nevertheless exhibits sufficient high inherent adhesiveness toward finely ground filler materials of the kind that can be employed in combination with such matrix materials to produce electronic substrates. Also unexpectedly, the production of useful composite materials using such matrix materials requires a complete reversal of approach from that which has previously been employed in the production of composite materials.

A major problem in the prior art processes used, and in the substrates obtained thereby, is the progressive loss of mechanical strength that results as the filler solids content is increased, and hitherto attempts to incorporate more than about 40 volume percent generally has resulted in composites which are so friable that they literally collapse to a heap of sand-like material if in testing they are stressed to the degree required in commercial practice. Moreover, it has been found difficult with prior art processes to incorporate as much as 40 volume percent solids material', since the mixtures become so viscous that uniform mixing is virtually impossible. Consequently, the approach has of necessity been to incorporate only as much filler material as will result in a substrate of adequate mechanical strength, and to accept the lower desired electric characteristics that result. It was discovered that with the methods of the prior inventions in the patents referred to above, for the successful production of composite materials, the solids content must instead be increased to values well beyond those of the conventional prior art. An acceptable minimum for these new composite materials is 60 volume percent, in that such materials are of the required minimum mechanical strength, it being found that the mechanical strength increases with increased solids content, instead of decreasing, up to the value of about 95–97 volume percent, or up to the value at which the proportion of polymer is reduced below the minimum value required to maintain adequate adhesion between the uniformly distributed filler particles.

A possible explanation for this highly unexpected result is that although the chosen polymers exhibit unusually high adhesion, especially toward oxide materials such as silica, aluminum oxide, metal powders and boron nitride, they are not particularly mechanically strong, and therefore are most effective in this new and special application if employed in the form of very thin adherent layers interposed between the filler particles, such as can only be obtained with the methods of the inventions and when the solids contents are sufficiently high. It is difficult to specify with any degree of accuracy the optimum thicknesses for the interposed polymer layers; it is known that layers of 1–3 micrometers are very successful in giving superior adhesion with adequate strength, and a possible upper limit is 40 micrometers (0.001 in).

Such composite materials can be made by mixing together the required portion by weight, or by volume, of particles of the chosen polymer material of sufficiently small dimension, or equivalent spherical dimension, e.g. in the range 0.1 to 50 micrometers, with the corresponding portion by weight or by volume of the chosen filler material, again of sufficiently small dimension, or equivalent spherical dimension, e.g. in the range 0.1 to 50 micrometers, and subjecting the mixture to a temperature sufficient to melt the polymer material, e.g. in the range 280–400° C. and to a pressure, e.g. in the range 3.5 to 1,380 MPa (500 to 200,000 psi), preferably 70 to 1,380 MPa (10,000 to 200,000 psi), sufficient to disperse the melted polymer material into the interstices between the particles of filler material. In alternative processes the polymer may be added in the form of a solution thereof, provided steps are taken to remove all of the solvent once the filler and polymer materials have been uniformly mixed together.

The resultant heated and pressurized composite mixture may be formed into sheets, films, tapes, or other articles useful in circuit design. In addition to an unmatched ease of manufacture of strong substrate materials, these composite materials have highly desirable electronic properties, and of particular interest are their dielectric properties. Thus, the invention permits careful selection and control of these electric properties. The composite materials may be fabricated by using powdered filler material that is a blend of two or more individual and potentially quite dissimilar materials that could not be joined by fusing them together, and in this way, the resultant effective dielectric constant of the resultant material can be carefully tailored and controlled. The relationship between the dielectric constant of the filler material or material mixture to the effective dielectric constant of the composite material is logarithmic, and therefore the composite must be heavily loaded with the filler material. Generally, such composite materials should have at least 60%, and preferably at least 80% by volume filler material. The filler material is finely powdered and can be selected from, but is not limited to, a group comprising aluminum nitride, barium titanate, barium-neodymium titanate, barium copper tungstate, lead titanate, lead magnesium niobate, lead zinc niobate, lead iron niobate, lead iron tungstate, strontium titanate, zirconium tungstate, alumina, fused quartz, boron nitride, and metal powders.

Figures 1, 3:
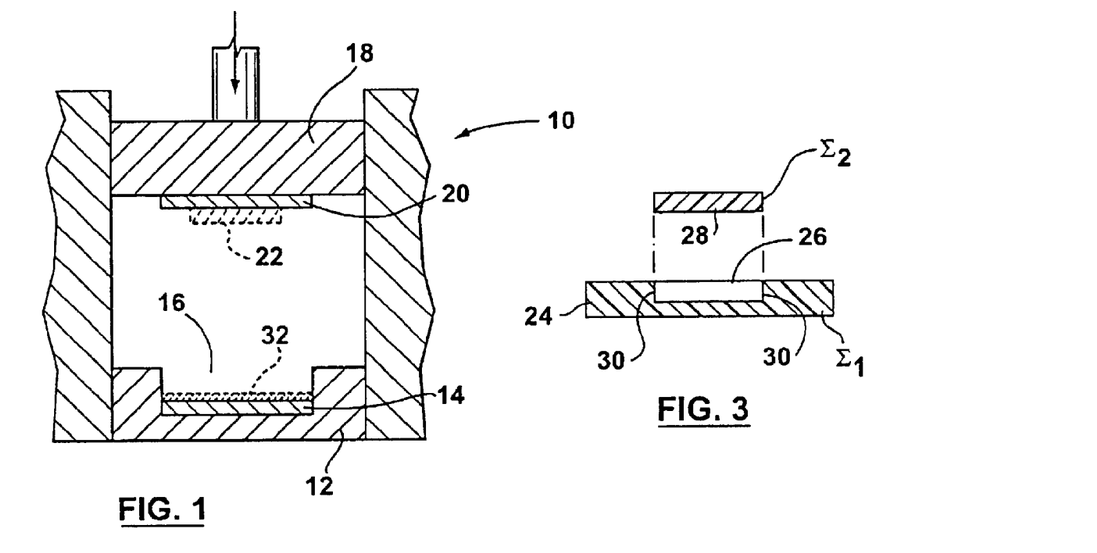
FIG. 1 illustrates a press mold apparatus used for application of heat and pressure during any of the manufacturing processes of the present invention.
FIG. 3 is a cross section through the substrate preform of FIG. 2, taken on the line 3—3 therein.
Figure 2:
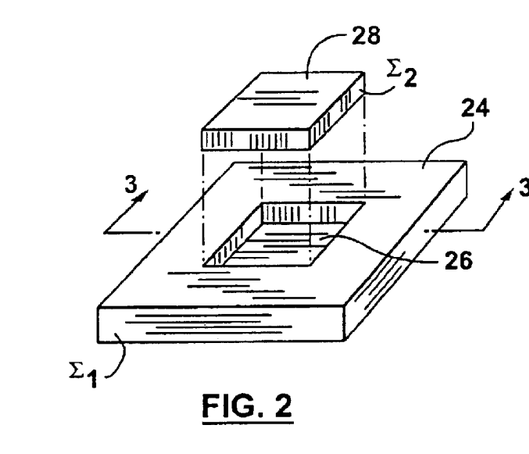
FIG. 2 illustrates a substrate preform manufactured in the press apparatus of FIG. 1, including a depository recess or well formed therein.

Such conditions required for formation of substrates and electric components are applied in a heated press or mold 10, as illustrated in FIG. 1, having a fixed heated platen 12 supporting a mold plate 14 in a cavity 16, and a movable heated platen 18 supporting a mold plate 20. In this particular embodiment the mold plate 20 supports a mold plate extension 22 which extends into the cavity 16 when the mold is fully closed. Assuming that the dielectric constant is the principal electric characteristic to be considered, a first mixture of filler and polymer materials with a particular first dielectric constant $\Sigma_1$ is placed in cavity 16 and subjected to heat and pressure by moving the heated platens 14 and 20 together, resulting in a substrate body 24 as seen in FIGS. 2 through 6 that is of square external shape. Owing to the presence of the extension 22, which is also of square shape but smaller than the body 24, the resultant incomplete substrate preform is formed with a square recess 26 therein extending partly through the thickness of the body 24. However, the recess may be any shape or dimension and the sides do not need to be straight. The composite material is easily machinable, so that instead of molding it in situ using the mold plate extension 22, the recess can be formed by removing material from the substrate preform body by any one of a number of different standard methods including, but not limited to, routing, drilling, cutting by laser or tool, or etching.

Figure 4:
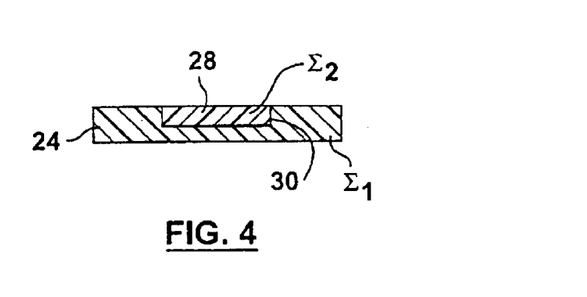
FIG. 4 is a cross section similar to FIG. 3 and illustrating a completed multi-dielectric substrate.
Figure 6:
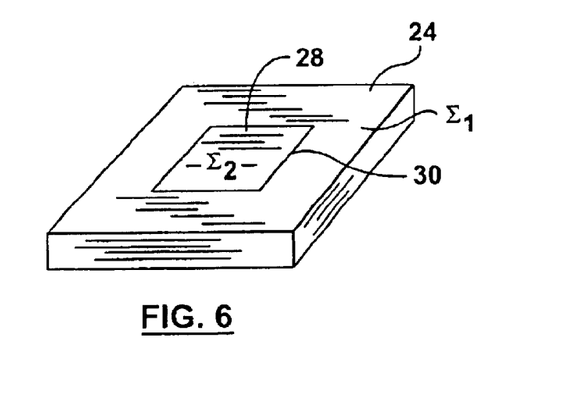
FIG. 6 is a perspective view from above of a completed substrate resulting from the substrate preforms of FIGS. 2 through 5.

The substrate preform 24 is then placed in a press mold from which the extension 22 is absent and an insert 28 of precisely the correct size and shape to fit within the recess 26 and fill it is placed therein. The insert has been formed from substantially an identical process in another press mold from a second mixture of filler and polymer materials, employing the same polymer or one that is completely compatible therewith, but with a different filler so as to obtain a particular chosen second dielectric constant $\Sigma_2$ different from the first. Alternatively the recess can be filled with precisely the correct quantity of the second filler/polymer mixture that has not yet been subjected to a forming pressing and heating operation. It will be noted that the polymer employed has the characteristic that, at temperatures at which it will provide a self-sustaining substrate preform and insert, it is still sufficiently thermoplastic to flow as required under the heat and pressure applied to the two mixtures; the temperature and pressure of the final press operation can be more intense than those used to form the preform and insert, to the extent that cross-linking and thermosetting may now take place. The combination of substrate preform 24 and insert 28 is then subjected in the press to sufficient heat and pressure that the binding matrix-forming polymer melts to form a homogenous material that will flow throughout the bodies, binding the particles of filler material into a homogenous matrix structure, as illustrated by FIGS. 4 and 6, having well defined regions of two distinctive dielectric constants, while at the same time solidly binding the preform and insert together.

Figure 5:
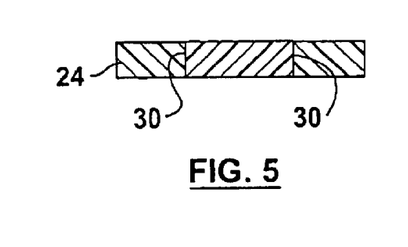
FIG. 5 is a cross section similar to FIG. 3 through a substrate preform in which the depository well extends completely through the thickness thereof.

FIG. 5 shows a resultant substrate using the steps described above for the embodiment of FIGS. 1–4 and 6, but in which the recess 26 extends the full depth of the substrate preform 24 and the insert 28 is of corresponding thickness so as to completely fill the recess. It is also possible to place both the first and second mixtures into a mold cavity before they have been subjected to any form of binding operation, and then subject them simultaneously to the final binding temperature and pressure. Since only the polymer melts to a fluid state the filler material tends to remain where it has been placed in the mold cavity, but there is some loss of control of the location of the boundary or boundaries between the matrixes that are formed, and also loss of control of the effective dielectric constant in undetermined portions of the regions immediately adjacent the boundary or boundaries.

Figure 7:
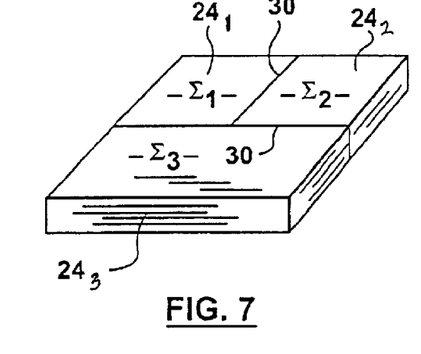
FIGS. 7 through 10 are perspective views respectively of other completed substrates.

Other methods according to the invention entail manufacture of each multiple electric characteristic substrate through the fusion edge to edge of a plurality of substrate preforms of the same thickness, each preform having a unique different electric constant, or any number of preforms of the same electric constant being separated by one or more other preforms of different electric constants. Since for the purpose they must be heated in a final step to a temperature at which the polymer becomes fluid they will need to be constrained within a suitable mold, such that illustrated and described. For example, as shown in FIG. 7, two smaller square preforms $24_1$ and $24_2$ are butted edge to edge with one another, and are in turn butted edge to edge with a rectangular preform $24_3$ to provide a square substrate having three discrete areas of dielectric constant $\Sigma_1$, $\Sigma_2$ and $\Sigma_3$ respectively. Boundaries 30 between the preforms are discrete, with substantially no mixing of the composite materials between the three well-defined dielectric regions. Of course, there may be some mixing, but if the process is practiced carefully, it can be limited to an acceptable degree. If necessary the preforms can be secured in the mold cavity before they joined together by a thin layer 32 (FIG. 1) of adhesive polymer, constituting an affixing layer. This affixing layer is as thin as possible and has a melting point and/or an evaporation point low enough for it to melt or evaporate when the mold platens are pressed together, leaving behind only the composite materials that were affixed thereon. If any residue does remain its effect on the dielectric constant must be taken into account.

Figure 8:
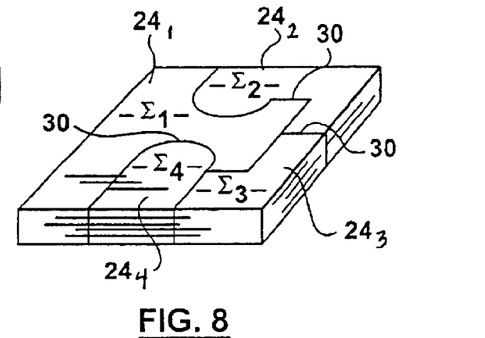
Figure 9:
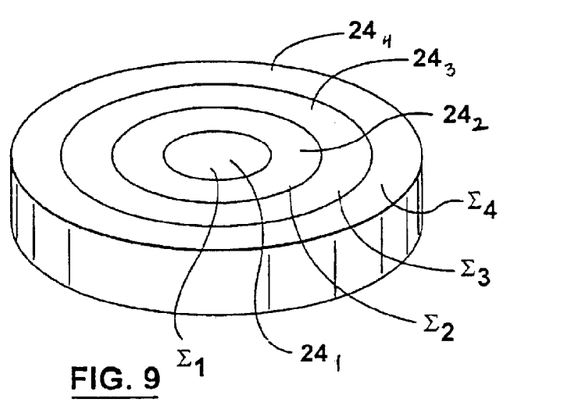
Figure 10:
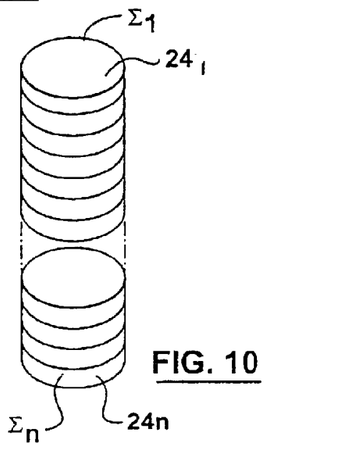

As described above, when subjected to the heat and pressure within the press mold, the matrix-forming, binding polymer material within the multiple substrate preforms becomes re-softened and the substrates become fused, but not mixed, together. Various dielectric regions can be selected and positioned within a substrate according to impedance matching requirements of a particular circuit to be mounted thereon, and substrates having multiple dielectric regions can be manufactured to have a variety of patterns. For example, as shown in FIG. 8, any number (four are shown) of preforms can be of irregular shapes which are fitted closely together as with a jigsaw puzzle. FIG. 9 shows the same number of preforms united to provide a disc-shaped substrate, the inner one $24_1$ of smallest diameter being of disc shape, while the three outer ones $24_2$–$24_4$ are of annular shape fitting snugly one within the other. FIG. 10 illustrates the manufacture of a cylindrical rod, such as might be used as the core for an inductive component, formed by adhering together a stack of the required length of a plurality of discs $24_1$–$24_n$ of different dielectric constant $\Sigma_1$–$\Sigma_n$, as required to obtain the desired characteristic that varies along the length of the rod. The possible combination and resulting pattern of multiple dielectric regions within a substrate is unlimited, and can for example form a checkerboard pattern, a spiral pattern, or any other pattern.

Figure 11:
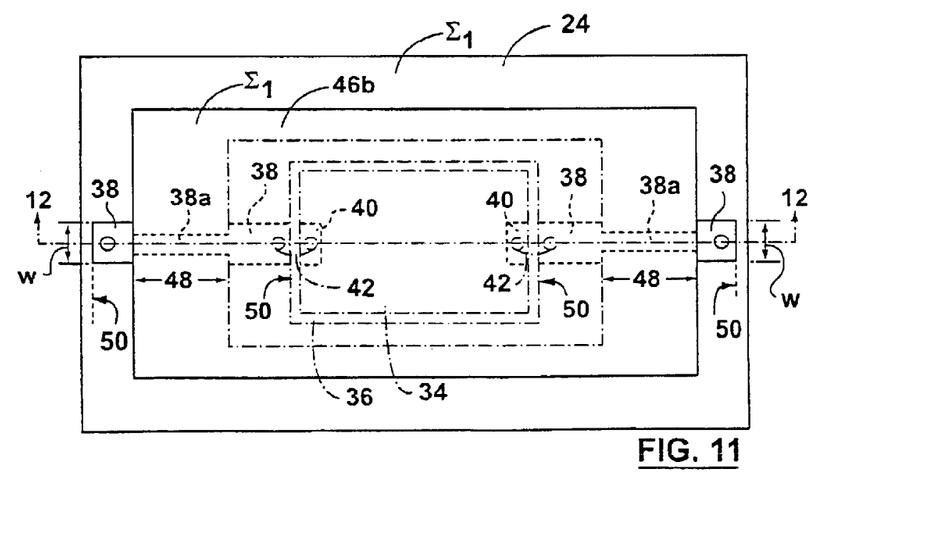
FIG. 11 is a plan view from above of a section of a Microstrip assembly employing the invention.
Figure 12:
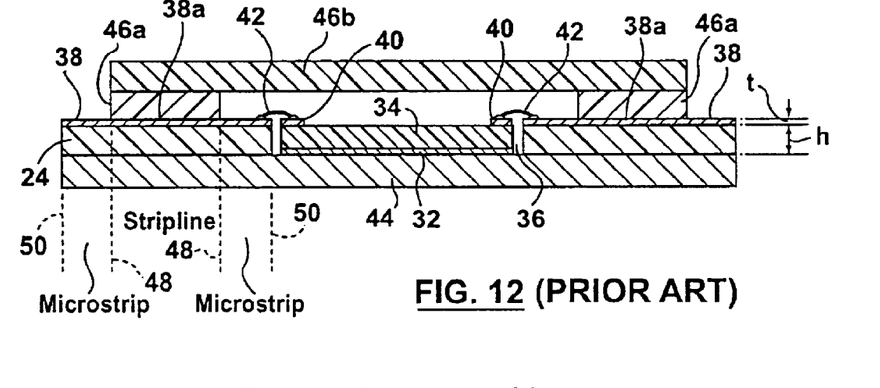
FIG. 12 is a cross section of the Microstrip assembly taken on the line 12—12 in FIG. 11.

FIGS. 11 and 12 illustrate the application of the invention to the type of transmission line, usually previously manufactured principally on printed circuit boards, but with the constant increase in operating frequencies requiring more demanding substrate materials, known as a "Microstrip". Typically this comprises pairs of parallel conductors or traces 34 running in close proximity to one another on one surface of the substrate and spaced by the thickness of the substrate body from a sheet metal electrode 36 constituting an image plane, or virtual ground plane. In this embodiment the conductors are of constant width while there is a change in dielectric constant from $\Sigma_1$ to $\Sigma_2$ of the intervening dielectric material at the junction 30 between the substrate portions $24_1$ and $24_2$. The width and thickness dimensions of the conductors are factors requiring careful consideration in the circuit design, as well as the dielectric constant values, and by suitable choice of the dielectric constants it may be possible to keep the conductors dimensions more nearly constant, facilitating the manufacture of the "Microstrip" line.

Figure 13:
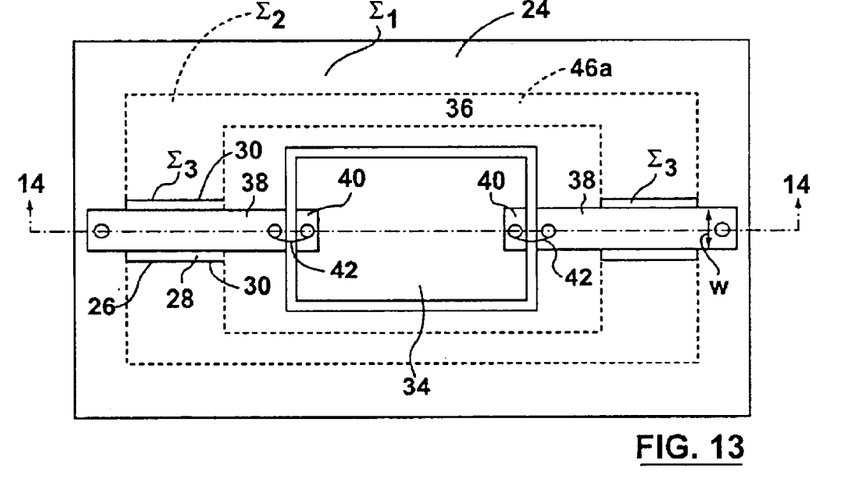
FIG. 13 is a plan view from above of a section of a Stripline assembly employing the invention.
Figure 14:
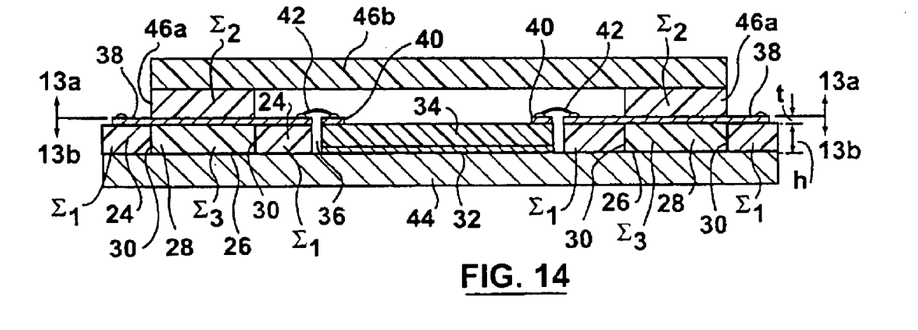
FIG. 14 is a cross section of the Stripline assembly taken on the line 14—14 in FIG. 13.

FIGS. 13 and 14 illustrate the application of the invention to the type of transmission line known as a "Stripline". Typically this also comprises pairs of parallel conductors or traces 34 running in close proximity to one another, but the conductors are embedded in the substrate body equally spaced from two sheet metal electrodes 36 on respective surfaces of the substrate, each sheet constituting a respective image or virtual ground plane. In this embodiment also the conductors are of constant dimensions along their length and can be maintained more easily so by suitable choice of different dielectric constants for different parts of the dielectric material. Owing to the embedding of the conductors there is more opportunity for variation in the dielectric constant, and it will be seen that four different materials are illustrated forming respective substrate parts $24_1$–$24_4$ having respective dielectric constants $\Sigma_1$–$\Sigma_4$ and meeting at longitudinal junctions 30 as well as transverse junctions 30. Owing to the use of these different materials each of the regions $24_1$–$24_n$ not only has a different dielectric constant, but also has as a different unique resistivity $R_1$–$R_n$ respectively, as well as differences in other electric and physical characteristics, and all of these will need to be considered in the final circuit design. Even further variation is possible with both "Microline" and "Stripline" transmission lines by forming the substrates of thin layers of different electric constants extending parallel to the conductors 34. It will be noted that in the absence of the embedded conductors 34 FIGS. 13 and 14 serve to illustrate the application of the invention to a capacitive device, which inherently consists of two thin flat parallel electrode plates separated by a thin layer of a dielectric material.

The methods of the invention therefore apply to the manufacture of electric and electronic components comprising a body of material having physical and/or electric characteristics, such as resistivity (or conductance) and/or dielectric constant that must be carefully controlled and are not easily achieved using any single material to form the body. The methods are used for a variety of components including, but not limited to, resistors (for which of course the prime consideration must be the resistivity of the material), and capacitors and inductors (for which of course the prime considerations must be respectively the dielectric constant and the magnetic permittivity of the material). Additionally, the methods allow for the manufacture of components having any chosen impedance, resistance, capacitance, inductance, etc., without necessarily compromising the size of the component itself, so that components having different electric characteristics can be manufactured to have virtually identical physical dimensions. This can be especially important when designing the physical layout of a circuit, as the designer will be able to select a component of any desired characteristic without regard to size; if subsequently a component must be changed for one of a different value then it can be done without having to move other elements on the substrate. Moreover, prior art methods frequently produce components with leads that are not flush and are not easily accessible without first being trimmed, such as by laser, while the methods of the invention can readily be made to yield components with flush leads, eliminating the need for such trimming. Such freedom removes many sizing constraints previously known to the circuit design process.

Figure 15:
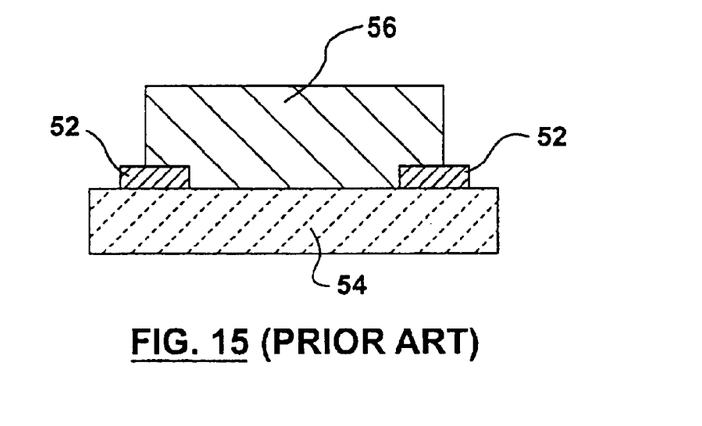
FIG. 15 illustrates a chip resistor manufactured according to prior art methods.

A typical structure for a prior art resistor is shown in FIG. 15. Conductive leads 38 are formed of highly conductive, non-corroding materials, such as gold or silver, and heat pressed onto a ceramic substrate 54. A body 56 of a highly resistive material (a resistor ink) of prescribed dimensions and resistivity is screen printed on one surface of the substrate 54 in engagement with the leads 52. Typical resistor inks comprise a mixture of ruthenium dioxide (RuO2) or pyrochlor together with glass powder in a suitable suspension medium. When heated the suspension component is removed, while the glass powder forms an adhesive matrix, thus producing the resistor. The substrate 54 must then be trimmed, such as by laser trimming, to expose the conductive leads, adding an additional step to the manufacturing process.

Figure 16:
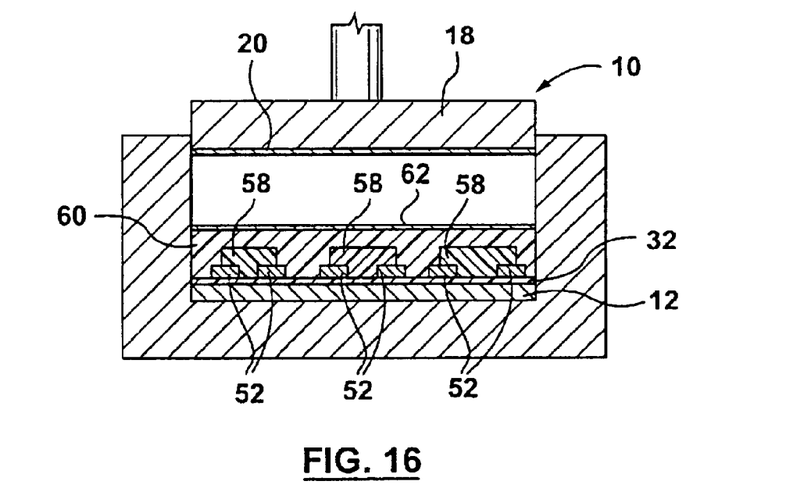
FIG. 16 illustrates the manufacture of a resistor according to a method of the present invention.
Figure 17:
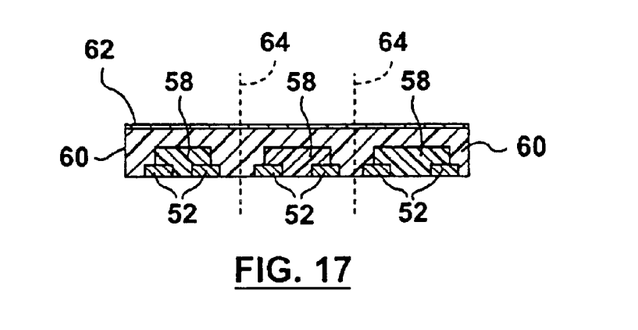
FIG. 17 illustrates electric components as manufactured with a press mold as in FIG. 16.

As illustrated in FIG. 16, in a method of the invention a thin layer 32 of an appropriate affixing binding polymer, which may be that used in the formation of the substrates in view of its high adhesiveness and complete subsequent compatibility, is deposited upon heated platen 12 of the press 10 and is used to hold firmly in place conductive leads 44 placed thereon, also formed of any highly conductive material, such as silver or gold. A pre-formed substrate of an appropriate material, such as in the case of a resistor a mixture of ruthenium dioxide and a polyarylene ether polymer, assembled as required with any of the configurations described above, is diced to form small resistor chips 46 58 of size and configuration required for the resistance value of the resultant resistor when finally produced. As is illustrated the size of the chips employed can vary in size, usually in accordance with the specific requirement as to the resistance value thereof. The resistor chips are placed upon respective pairs of conductive leads 52 and pressed into the thin layer 32 of binding polymer sheet. The mold cavity is then back filled to the level as indicated, with any high temperature encapsulating backfill material 60, preferably the same polymer that has been used in the production of the resistor chips so as to be completely compatible therewith. A thin metal layer 62 of, for example, platinum is then deposited on top of the back-fill material, and the assembly is subjected to heat and pressure between heated platens 12 and 18. The heat and pressure are such that the binding thin layer 32 of polymer melts sufficiently to be squeezed out from beneath the leads 52 and become incorporated in the backfill material, exposing the conductive leads. The result is an electric component which is characterized in that each of the regions $24_1$–$24_n$ has as its electric characteristic a different unique resistivity $R_1$–$R_n$ respectively. As shown in FIG. 17, when the resultant workpiece is removed from the press the result is a block comprising a plurality (usually a very large number) of resistor components, each with flush exposed conductive leads and no need for trimming. The block is then separated into the individual resistors along separator lines, preferably to be of identical exterior dimensions, despite the different sizes and resistance values of the resistor chips therein.

Thus, although the invention has been described as applied to the production of resistors it is apparent that it can equally be applied to any component in which the operative element can be formed from a block of a polymer/filler material. For example, in other embodiments the resistor chips or their equivalent constitutes one region of the component, and the component can be made to have any desired impedance, including resistance and/or capacitance and/or inductance by use in the backfill material 60 of particles of chosen electric characteristic, such as resistivity, dielectric constant, etc. to produce components with any desired effective electric characteristic. In such embodiments the backfill material not only serves as an intrinsic part of the component but also as packaging material enclosing the other parts. It will be understood by those skilled in the art that any two filler materials of one different electric characteristic, such as dielectric constant, are unlikely to have any other characteristic, such as resistivity, thermal coefficient of expansion, etc. identical, and, there are many other such characteristics that usually will need to be carefully considered in the final choice of the material to be used. The result is a manufacturing process capable of producing substrates for electric circuits and electric components having equal physical dimensions and variable effective characteristics. Components manufactured according to the methods of the invention can be mounted upon substrates having multiple dielectric constants, as previously described.

Those skilled in the art will recognize that these novel manufacturing methods make possible an entirely new class of substrates to be used in circuit design, whereby impedance matching is inherently facilitated with the possibility of exceptional flexibility in component layout. Many modifications and variations of the invention are possible with the guidance of the above teachings. The polymer or polymers that can be employed is not limited to the polyarylene ethers specifically disclosed, but can be any non-polarized polymer material with adequate adhesive properties and sufficient thermoplastic capability to permit it to function also a bonding agent.

While the specification describes particular embodiments of the present invention, those of ordinary skill can devise variations of the present invention without departing from the inventive concept.

We claim:

1. A substrate or electric component comprising a body of polymer/filler composite material and having different values of an electric characteristic in different co-planar body regions thereof, comprising:

at least a first body region having a first electric characteristic and first polymer; and at least a second body region joined to the first region to have a boundary between them, the second body region having a second polymer and having a second electric characteristic of value different from that of the same electric characteristic of the first body region, wherein the first and second polymers of the at least first body region and the at least second body region achieve the joining of the at least first body region and said at least second body region to each other by a heating and pressing operation whereby said at least first and second body regions provide desired said first and second electric characteristics.

2. A substrate or electric component as claimed in claim 1 wherein each of said body regions has as its electric characteristic a different dielectric constant.

3. A substrate or electric component as claimed in claim 1 wherein each of said body regions has as its electric characteristic a different resistivity.

4. A substrate or electric component as claimed in claim 1, wherein multiple body regions form a pattern.

5. A substrate or electric component as claimed in claim 4, wherein multiple body regions form a nonuniform pattern.

6. A substrate or electric component as claimed in claim 1, wherein at least one of the body regions has polymer/filler material comprised of a mixture of filler materials of selected electric characteristics.

7. A substrate or electric component as claimed in claim 6, wherein polymer/filler material of the at least one body regions comprises a mixture of filler materials of selected electric characteristics and nonpolar, nonfunctionalized polymer material with at least 80% by volume of filler material.

8. A substrate or electric component as claimed in claim 1, wherein the second body region is disposed in a recess in the first body region.

* * * * *